United States Patent
Hill

(10) Patent No.: US 6,389,575 B1
(45) Date of Patent: May 14, 2002

(54) DATA INTEGRITY CHECKING APPARATUS

(75) Inventor: Robin Hill, Shirley (GB)

(73) Assignee: Lucas Industries public limited company, London (GB)

(*) Notice: Subject to any disclaimer, the term of this patent is extended or adjusted under 35 U.S.C. 154(b) by 0 days.

(21) Appl. No.: 09/345,585

(22) Filed: Jun. 30, 1999

(30) Foreign Application Priority Data

Jul. 7, 1998 (GB) ............................................. 9814608

(51) Int. Cl.$^7$ .................... G06F 11/10; H03M 13/00; G11C 29/00
(52) U.S. Cl. .............................. 714/807; 714/773
(58) Field of Search ......................... 714/719, 819, 714/763, 773, 807

(56) References Cited

U.S. PATENT DOCUMENTS

| | | | | |
|---|---|---|---|---|
| 3,697,949 A | * | 10/1972 | Carter et al. | 714/763 |
| 5,539,754 A | * | 7/1996 | Zuras, Jr. et al. | 714/785 |
| 5,588,006 A | | 12/1996 | Nozuyama | 371/3 |
| 5,696,954 A | * | 12/1997 | Guttag et al. | 712/221 |

FOREIGN PATENT DOCUMENTS

| EP | 438 322 A2 | 7/1991 | | |
|---|---|---|---|---|
| EP | 441 518 A2 | 8/1991 | | |
| GB | 2255213 A | * | 10/1992 | G11C/29/00 |

OTHER PUBLICATIONS

Reverse Rotation Fire Code ECC Correction: Publication–Data: IBM Technical Disclosure Bulletin, Oct. 1987, US; vol No.: 30; Issue No.: 5; p. No.: 41–44; Publication–Date: Oct. 1, 1987.*

Partial Parity Predict for CPU having Architectural Rotate and Mask/Merge Unit. Feb. 1981; Publication–Data: IBM Technical Disclosure Bulletin, Feb. 1981, US; vol. No.: 23; Issue No.: 9; p. No.: 4126–4127; Publication–Date: Feb.*

* cited by examiner

Primary Examiner—Albert Decady
Assistant Examiner—Joseph D. Torres
(74) Attorney, Agent, or Firm—Wells St. John P.S.

(57) ABSTRACT

A data integrity checking apparatus including an array of n latch circuits, each latch circuit having an input terminal and an output terminal, an array of n exclusive OR (XOR) gates, each XOR gate having two inputs and an output, the output terminals of the XOR gates are connected to the input terminals of respective ones of the latch circuits, the XOR gates receiving as one input bit-rotated words from the outputs of the latch circuits and as another input successive words of the data to be checked.

14 Claims, 1 Drawing Sheet

Figure 1:
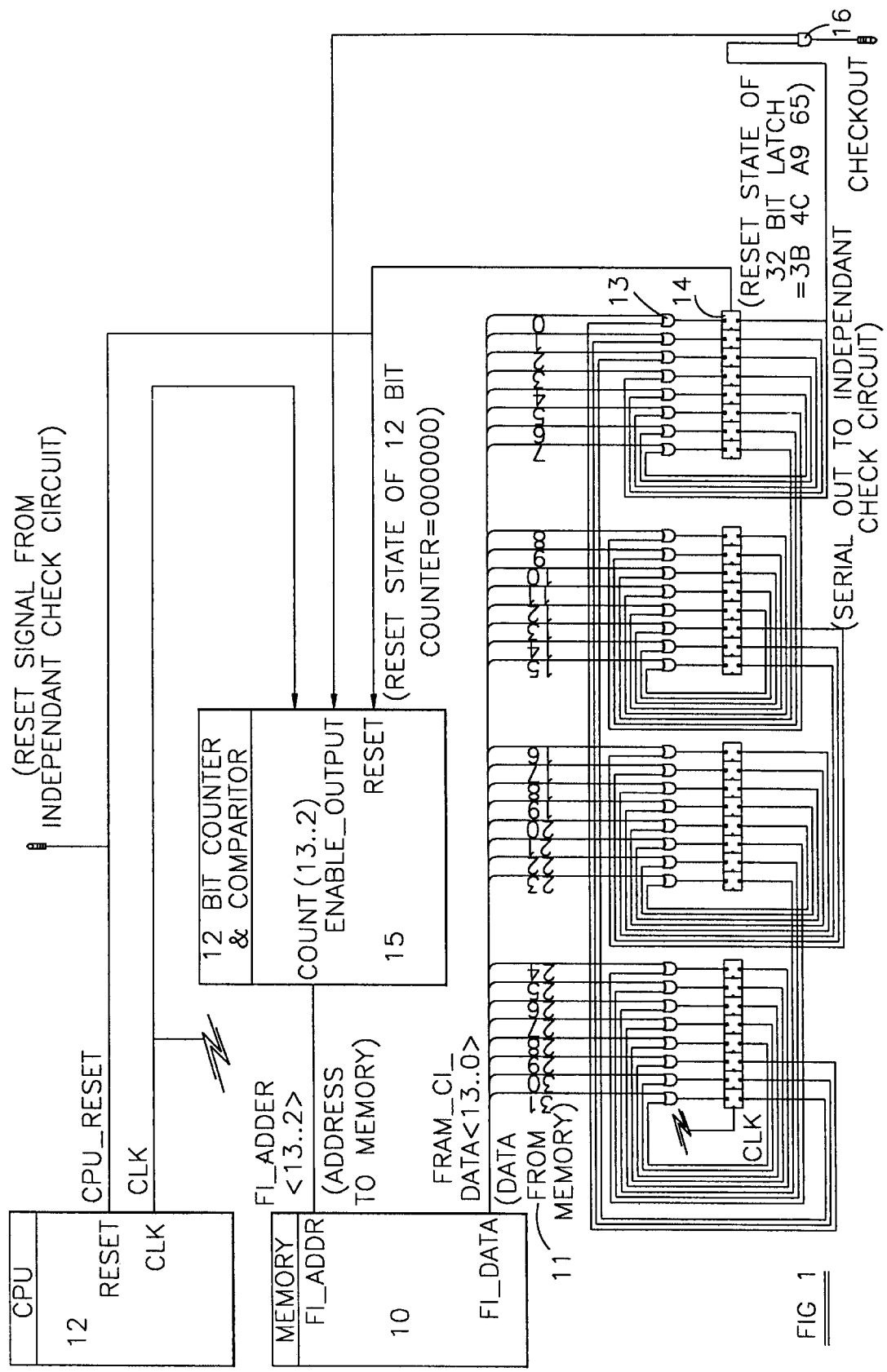

DATA INTEGRITY CHECKING APPARATUS

This invention relates to a data integrity checking apparatus for use, for example, in repeatedly checking the integrity of data, such as program instructions, held in a block of RAM.

Various checking arrangements have already been proposed in which successive words of the stored data are supplied to the checking apparatus and a checksum value is generated. This is checked against a known result to determine whether the data is correct. However, there is a danger with apparatus of this type that, as a result of a failure of a component of the checker, the output thereof could remain "stuck" at a previously determined correct value.

It is an object of the present invention to provide a data integrity data checking apparatus in which this difficulty is avoided.

A data integrity checking apparatus in accordance with the invention comprises an array of n latch circuits, an array of n exclusive OR gates having output terminals connected to the input terminals of respective ones of the latch circuits, the exclusive OR gates receiving as one input, bit-rotated words from the outputs of the latch circuits and as another input successive words of the data to be checked.

The number of bits by which words are rotated in each cycle is an even number when n is odd and an odd number when n is even, so that each bit of the checksum is passed through every latch and exclusive OR gate.

Preferably, when the word length n is 32, the bit-rotated words from the outputs of the latch circuits are bit-rotated by 3 bits.

The apparatus preferably includes means for serially clocking out the final word held by the latch circuits from one of the latch circuits.

In accordance with another aspect of the invention there is provided a digital processing system including a program instruction RAM store and a an apparatus for checking the integrity of the data stored in said program instruction RAM store, said apparatus comprising an array of n latch circuits, an array of n exclusive OR gates with outputs connected to the inputs of respective ones of the latch circuits, the outputs of the latch circuits being connected to the inputs of the exclusive OR gates so as to apply thereto a bit-rotated word, and an address controller connected to the RAM store so as to cause it to output the data stored therein in successive n-bit words to the exclusive OR gate array in synchronism with clocking of data from the exclusive OR gate array into the latch circuit array.

Preferably, the RAM store data is arranged so that the n words at the highest addresses thereof are set to zero, so that an output word can be serially clocked out of one of the latch circuit during the last n clock events of each test cycle.

The sole figure of the accompanying drawing is a circuit diagram showing one example of the invention.

The drawing shows a program instruction RAM store 10, forming part of a digital processing system 11, including a CPU 12. The RAM store is organised to hold a large number M of 32-bit words. The 32 words of the store at the highest 32 addresses all contain zeros. The checking apparatus includes an array 13 consisting of 32 exclusive OR gates and an array 14 consisting of 32 single-bit latch circuits. The gates 13 have inputs connected respectively to the 32 data output connections of the RAM store 10 and outputs connected to the inputs of respective ones of the latches. The outputs of the latches are connected back to the inputs of the exclusive OR gates with a bit-rotation of 3-bits. For example, the latch circuit on the far right in the drawing, which is the LSB latch circuit, is connected to an input of the fourth exclusive OR gate.

The checking apparatus also includes an address controller 15 which is clocked by the CPU at times when the latter is not accessing program instructions so that successive 32 bit words are supplied to the exclusive OR gates together with the bit-shifted 32 bit words from the latch circuit outputs and the result is transferred to the respective latch circuits. During initialisation of the digital processing system, the 12 bit counter in the address controller is reset to 0 and the latch circuits are set to an initial value of HEX 3B 4C A9 65. On each clock cycle the value of the 32 bit word held by the latch circuits is changed in accordance with the value of the next word from the RAM store. When the count reaches a value such that the first of the last 32 words is ready to be output, a serial output enable signal is produced by the address controller 15 and this is supplied to one input of an AND gate 16 the other output of which is connected to the output of the LSB latch circuit. As the last 32 zero value words are input to the exclusive OR gates the final word held in the latches is output serially via gate 16.

The contents of the RAM store are so organised (by way of the inclusion of a word not used by the program, but present only for use in the cyclic checking process) that the total result of the multiple iterations of the bit shifted exclusive OR operation is the addition to the initial value of HEX 80 00 00 00, so that two complete cycles will return the result to the initial value.

Thus, if the data held in the RAM remains correct, two different 32 bit words are clocked out of the checking apparatus to an independent check circuit on alternate checking cycles. These can be compared with the expected values by the independent check circuit. It will be appreciated that, since the two words alternate, any fault which causes the latch to become stuck at a specific value will be detected by the independent check circuit. The check circuit may provided by completely separate hardware or it may form a part of the CPU.

What is claimed is:

1. A digital processing system including a program instruction store and an apparatus for checking the integrity of data stored in said program instruction store, said apparatus including a clock, an array of n latch circuits, each latch circuit having an input terminal and an output terminal, an array of n exclusive OR (XOR) gates, each XOR gate having two inputs and an output, the output terminals of the XOR gates are connected to the input terminals of respective ones of the latch circuits, the outputs of the latch circuits being connected to the inputs of the XOR gates so as to apply thereto a bit-rotated word, and an address controller connected to the program instruction store so as to cause the program instruction store to output the data stored therein in successive n-bit words to the XOR gate array in synchronism with the clocking of data from the XOR gate array into the latch circuit array.

2. A digital processing system as claimed in claim 1 wherein the number of bits by which words are rotated in each cycle is an even number when the word length n is odd and an odd number when the word length n is even.

3. A digital processing system as claimed in claim 2 wherein the bit-rotated words from the output of the latch circuits are rotated by 3 bits, when the word length n is 32.

4. A digital processing system as claimed in claim 1 wherein the program instruction store Is a RAM program instruction store.

5. A digital processing system as claimed in claim 4 wherein the number of bits by which words are rotated in each cycle is an even number when the word length n is odd and an odd number when the word length n is even.

6. A digital processing system as claimed in claim 4 wherein the RAM program instruction store data is arranged so that the n words at the highest address thereof are set to zero such so that an output word can be serially clocked out of one of the latch circuits during the last n clock events of each test cycle.

7. A digital processing system as claimed in claim 6 wherein the number of bits by which words are rotated in each cycle is an even number when the word length n is odd and an odd number when the word length n is even.

8. A digital processing system as claimed in claim 6 wherein the serially output word from the latch circuits is compared to a reference word.

9. A digital processing system as claimed in claim 8 wherein the number of bits by which words are rotated in each cycle is an even number when the word length n is odd and an odd number when the word length n is even.

10. A digital processing system as claimed in claim 8 wherein the reference word alternates between two values on alternate checking cycles.

11. A digital processing system as claimed in claim 10 wherein the number of bits by which words are rotated in each cycle is an even number when the word length n is odd and an odd number when the word length n is even.

12. A data Integrity checking apparatus as claimed in claim 1 wherein the apparatus includes means for serially clocking out the final word held by the latch circuits from one of the latch circuits as a checksum word which is compared to a reference word.

13. A data integrity checking apparatus as claimed in claim 12 wherein the number of bits by which words are rotated in each cycle is an even number when the word length n is odd and an odd number when the word length n is even.

14. A data integrity checking apparatus as claimed in claim 1 wherein the reference word alternates between two values on alternate checking cycles, and wherein the number of bits by which words are rotated in each cycle is an even number when the word length n is odd and an odd number when the word length n is even.

* * * * *